US010145916B2

(12) United States Patent
Lee et al.

(10) Patent No.: US 10,145,916 B2
(45) Date of Patent: Dec. 4, 2018

(54) MAGNETIC RESONANCE IMAGING APPARATUS AND METHOD OF SCANNING MAGNETIC RESONANCE IMAGE USING THE SAME

(71) Applicant: SAMSUNG ELECTRONICS CO., LTD., Suwon-si (KR)

(72) Inventors: Dae-ho Lee, Seongnam-si (KR); Sang-cheon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 170 days.

(21) Appl. No.: 15/405,966

(22) Filed: Jan. 13, 2017

(65) Prior Publication Data

US 2017/0234954 A1   Aug. 17, 2017

(30) Foreign Application Priority Data

Feb. 12, 2016 (KR) ........................ 10-2016-0016348

(51) Int. Cl.
*G01R 33/483* (2006.01)
*G01R 33/56* (2006.01)
*G01R 33/48* (2006.01)

(52) U.S. Cl.
CPC ..... *G01R 33/4835* (2013.01); *G01R 33/5607* (2013.01); *G01R 33/4818* (2013.01)

(58) Field of Classification Search
CPC ............ G01R 33/4835; G01R 33/5607; G01R 33/4818
See application file for complete search history.

(56) References Cited

U.S. PATENT DOCUMENTS

| 5,528,144 | A | 6/1996 | Gullapalli et al. |
| 7,859,263 | B2 | 12/2010 | Matsuda et al. |
| 9,476,955 | B2 | 10/2016 | Stemmer |
| 2009/0179641 | A1 | 7/2009 | Matsuda et al. |

(Continued)

FOREIGN PATENT DOCUMENTS

| JP | 2006122301 A | 5/2006 |
| JP | 2009-160342 A | 7/2009 |

(Continued)

OTHER PUBLICATIONS

Communication dated Aug. 8, 2017, issued by the Korean Intellectual Property Office in corresponding Korean Application No. 10-2016-0016348.

(Continued)

*Primary Examiner* — Rodney Bonnette
(74) *Attorney, Agent, or Firm* — Sughrue Mion, PLLC

(57) ABSTRACT

A magnetic resonance imaging (MRI) apparatus includes a radio frequency (RF) controller configured to, for a repetition time period, control the MRI apparatus to apply, to an object, an RF preparation pulse having a coverage area covering two or more slices among a plurality of slices of the object, control the MRI apparatus to apply, to the object, RF pulses respectively corresponding to the plurality of slices, and move the coverage area. The MRI apparatus further includes a data acquirer configured to acquire magnetic resonance signals from the plurality of slices during the repetition time period.

20 Claims, 9 Drawing Sheets

(56) References Cited

U.S. PATENT DOCUMENTS

| | | | |
|---|---|---|---|
| 2010/0237863 A1* | 9/2010 | Stemmer | A61B 5/055 |
| | | | 324/309 |
| 2012/0019251 A1* | 1/2012 | Umeda | G01R 33/56518 |
| | | | 324/322 |
| 2013/0335080 A1 | 12/2013 | Jo et al. | |
| 2015/0035531 A1 | 2/2015 | Stemmer | |
| 2015/0323630 A1* | 11/2015 | Weingartner | G01R 33/543 |
| | | | 324/309 |
| 2016/0170002 A1* | 6/2016 | Park | G01R 33/4835 |
| | | | 324/309 |
| 2017/0146625 A1* | 5/2017 | Beck | G01R 33/4835 |

FOREIGN PATENT DOCUMENTS

| | | |
|---|---|---|
| KR | 101301490 B1 | 8/2013 |
| KR | 10-2013-0106797 A | 9/2013 |
| KR | 1020130099612 A | 9/2013 |
| KR | 10-2015-0014887 A | 2/2015 |
| KR | 1020150128607 A | 11/2015 |

OTHER PUBLICATIONS

Communication dated Apr. 13, 2017, issued by the Korean Intellectual Property Office in counterpart Korean Application No. 10-2006-0016348.

Communication dated Apr. 19, 2017, issued by the International Searching Authority in counterpart International Application No. PCT/KR2017/000363 (PCT/ISA/220, 210, 237).

* cited by examiner

MAGNETIC RESONANCE IMAGING APPARATUS AND METHOD OF SCANNING MAGNETIC RESONANCE IMAGE USING THE SAME

CROSS-REFERENCE TO RELATED APPLICATION

This application claims priority from Korean Patent Application No. 10-2016-0016348, filed on Feb. 12, 2016, in the Korean Intellectual Property Office, the disclosure of which is incorporated herein by reference in its entirety.

BACKGROUND

1. Field

Apparatuses and methods consistent with exemplary embodiments relate to a magnetic resonance imaging apparatus and a method of scanning a magnetic resonance image using the same, and more particularly, to a magnetic resonance imaging apparatus that acquires magnetic resonance signals from a plurality of slices by using a preparation pulse, and a method of scanning a magnetic resonance image using the same.

2. Description of the Related Art

Magnetic resonance imaging (MRI) apparatuses are used to scan an image of an object by using a magnetic field. MRI apparatuses are widely used for accurate diagnosis of diseases because they show bones, discs, joints, nerves, ligaments, etc. three-dimensionally at a desired angle.

In an MRI apparatus, magnetic resonance (MR) signals are acquired and the acquired MR signals are reconstructed into an image and output. In detail, the MRI apparatus acquires MR signals by using an RF multi-coil including RF coils, a permanent magnet, and a gradient coil.

Among scanning techniques of MRI apparatuses, a fluid-attenuated inversion recovery (FLAIR) technique is a type of an inversion recovery technique that restricts signals of cerebrospinal fluid.

Because all MR images according to the FLAIR technique are generated by using long repetition time TR and echo time TE, a cerebrospinal fluid signal is restricted and thus appears to be black in an image by the FLAIR technique. Accordingly, lesions may be accurately observed on an image generated by the FLAIR technique in which the cerebrospinal fluid signals are restricted, and diseases occurring around a ventricle may be easily determined.

In the FLAIR technique, an inversion pulse is applied ahead of an excitation pulse. To effectively restrict the cerebrospinal fluid signal, while having a sufficient coverage area, the inversion pulse does not affect other slices. Accordingly, in an existing FLAIR technique, to adjust an interval between slices, the slices are classified into a plurality of slice sets, and each slice set is repeatedly scanned. However, the existing technique may use an increased scan time, which may prevent a clinical use of the technique.

SUMMARY

Exemplary embodiments may address at least the above problems and/or disadvantages and other disadvantages not described above. Also, the exemplary embodiments are not required to overcome the disadvantages described above, and may not overcome any of the problems described above.

Exemplary embodiments provide a magnetic resonance imaging apparatus and a method of scanning a magnetic resonance image using the same.

According to an aspect of an exemplary embodiment, there is provided a magnetic resonance imaging (MRI) apparatus including a radio frequency (RF) controller configured to, for a repetition time period, control the MRI apparatus to apply, to an object, an RF preparation pulse having a coverage area covering two or more slices among a plurality of slices of the object, control the MRI apparatus to apply, to the object, RF pulses respectively corresponding to the plurality of slices, and move the coverage area. The MRI apparatus further includes a data acquirer configured to acquire magnetic resonance signals from the plurality of slices during the repetition time period.

The MRI apparatus may further include a gradient controller configured to control the MRI apparatus to apply different phase encoding gradients to the two or more slices covered by the coverage area.

The gradient controller may be further configured to determine each of the phase encoding gradients, based on either one or both of a position of a slice in the coverage area and a k-space sampling pattern.

The gradient controller may be further configured to control the MRI apparatus to apply a first phase encoding gradient to a slice that is located at a center of the coverage area to acquire k-space data of a center of a k-space, and apply a second phase encoding gradient to a slice that is located at an edge of the coverage area to acquire k-space data of an edge of the k-space.

The RF controller may be further configured to, for the repetition time period, move the coverage area in a unit of a slice.

As the coverage area is moved, the two or more slices covered by the coverage area may be changed.

The RF controller may be further configured to determine times of the application of the RF pulses to the object, based on a slice that is located at a center of the coverage area, and control the MRI apparatus to apply, to the object, the RF pulses respectively corresponding to the plurality of slices, based on the determined times.

The RF preparation pulse may be any one or any combination of an inversion pulse, a labeling pulse, a T1 preparation pulse, and a T2 preparation pulse.

The RF controller may be further configured to control the MRI apparatus to apply, to the object, the RF pulses respectively corresponding to the plurality of slices, based on any one or any combination of a spin echo technique, a gradient echo technique, and a fast spin echo technique.

According to an aspect of an exemplary embodiment, there is provided a method of scanning a magnetic resonance image, using a multi-slice technique, the method including, for a repetition time period, applying, to an object, a radio frequency (RF) preparation pulse having a coverage area covering two or more slices among a plurality of slices of the object, applying, to the object, RF pulses respectively corresponding to the plurality of slices, and moving the coverage area. The method further includes acquiring magnetic resonance signals from the plurality of slices during the repetition time period.

The method may further include applying different phase encoding gradients to the two or more slices covered by the coverage area.

The applying of the phase encoding gradients may include determining each of the phase encoding gradients, based on a position of a slice in the coverage area.

The applying of the phase encoding gradients may include applying a first phase encoding gradient to a slice that is located at a center of the coverage area to acquire k-space data of a center of a k-space, and applying a second phase encoding gradient to a slice that is located at an edge of the coverage area to acquire k-space data of an edge of the k-space.

The moving of the coverage area may include, for the repetition time period, moving the coverage area in a unit of a slice.

As the coverage area is moved, the two or more slices covered by the coverage area may be changed.

The applying of the RF pulses may include determining times of the application of the RF pulses to the object, based on a slice that is located at a center of the coverage area, and applying, to the object, the RF pulses respectively corresponding to the plurality of slices, based on the determined times.

The RF preparation pulse may be any one or any combination of an inversion pulse, a labeling pulse, a T1 preparation pulse, and a T2 preparation pulse.

The applying of the RF pulses may include applying, to the object, the RF pulses respectively corresponding to the plurality of slices, based on any one or any combination of a spin echo technique, a gradient echo technique, and a fast spin echo technique.

A non-transitory computer-readable storage medium may store a program to cause a computer to perform the method.

According to an aspect of an exemplary embodiment, there is provided a magnetic resonance imaging (MRI) apparatus including a radio frequency (RF) controller configured to control the MRI apparatus to apply a first RF preparation pulse to a first coverage area including first slices among a plurality of slices of an object during a first repetition time period, and control the MRI apparatus to apply RF pulses respectively to the plurality of slices to which the first RF preparation pulse is applied, during the first repetition time period. The RF controller is further configured to move the first coverage area in a unit of a slice to a second coverage area including second slices among the plurality of slices during a second repetition time period, the second slices being different than the first slices, control the MRI apparatus to apply a second RF preparation pulse to the second coverage area during the second repetition time period, and control the MRI apparatus to apply the RF pulses respectively to the plurality of slices to which the second RF preparation pulse is applied, during the second repetition time period. The MRI apparatus further includes a data acquirer configured to acquire magnetic resonance signals from the plurality of slices during the first repetition time period and the second repetition time period.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
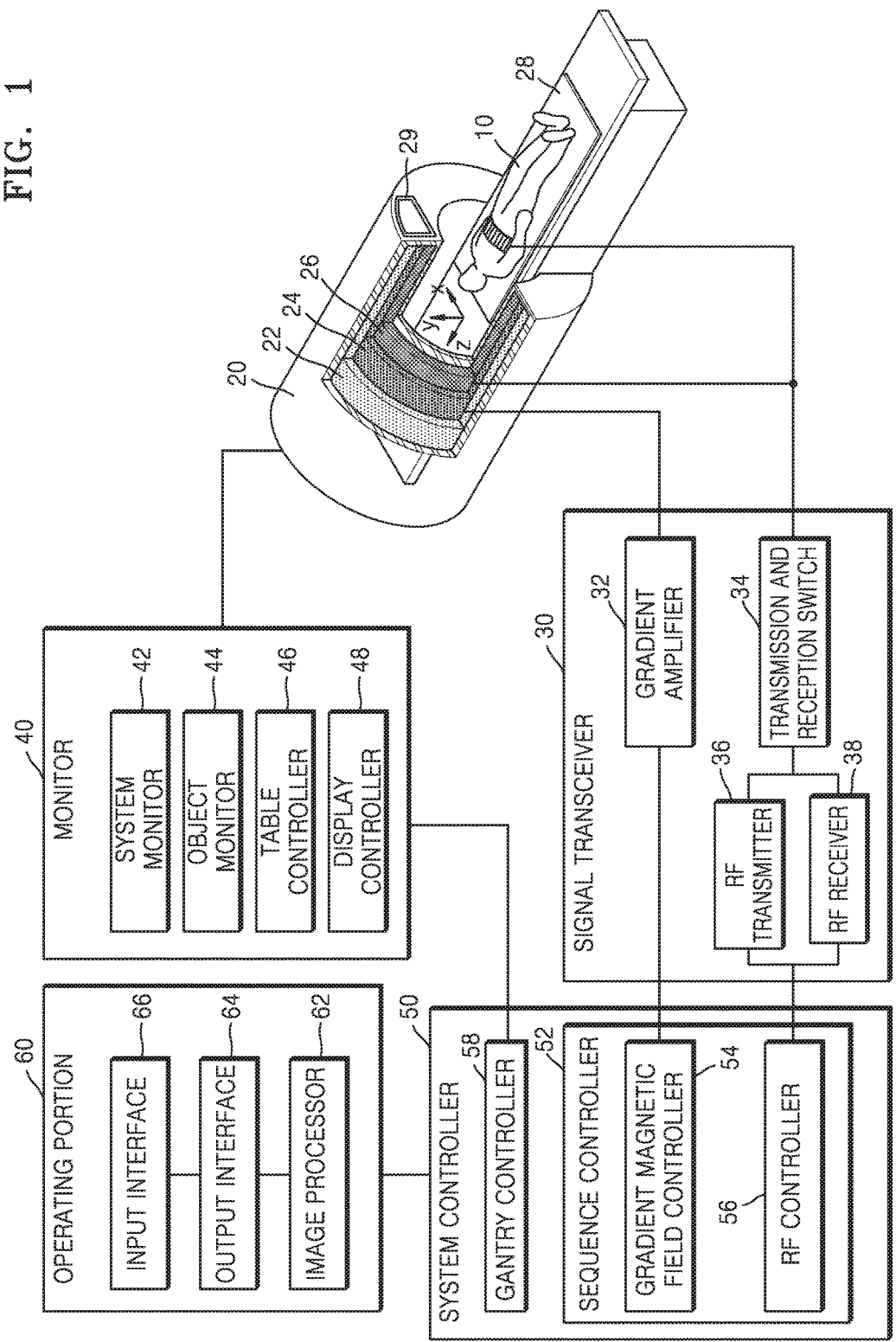
FIG. 1 is a block diagram of a general magnetic resonance imaging (MRI) system.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail because they would obscure the description with unnecessary detail.

When a part "includes" or "comprises" an element, unless there is a description contrary thereto, the part can further include other elements, not excluding the other elements. Also, the term "unit" in the exemplary embodiments may mean a software component or hardware component such as a field-programmable gate array (FPGA) or an application-specific integrated circuit (ASIC), and perform a specific function. However, the term "unit" is not limited to software or hardware. The "unit" may be formed to be in an addressable storage medium, or may be formed to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units," or may be divided into additional components and "units."

Throughout the specification, an "image" may mean multi-dimensional data formed of discrete image elements, e.g., pixels in a two-dimensional (2D) image and voxels in a three-dimensional (3D) image. For example, an image may be a medical image of an object acquired by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. The object may be a phantom. The phantom may mean a material having a density, an effective atomic number, and a volume that are approximately the same as those of an organism. For example, the phantom may be a spherical phantom having properties similar to the human body.

Furthermore, in the present specification, a "Magnetic Resonance Imaging (MRI)" may refer to an image of an object acquired by using the nuclear magnetic resonance principle.

Furthermore, in the present specification, a "pulse sequence" may refer to continuity of signals repeatedly applied by an MRI apparatus. The pulse sequence may include a time parameter of a radio frequency (RF) pulse, for example, repetition time (TR) period or echo time (TE) period.

Furthermore, in the present specification, a "pulse sequence schematic diagram" may show an order of events that occur in an MRI apparatus. For example, the pulse sequence schematic diagram may be a diagram showing an RF pulse, a gradient magnetic field, an MR signal, or the like according to time.

Also, in the present specification, the term "repetition time TR" may signify a repetition time of RF pulses. For example, the repetition time TR may signify a time from a time point when an RF pulse having an amount is transmitted to a time point when another RF pulse having the same amount is transmitted.

Also, in the present specification, the term "echo time TE" may signify a time from transmission of an RF pulse to measurement of a magnetic resonance signal.

Also, in the present specification, the term "spatial encoding" may signify acquiring spatial information according to an axis (direction) of a gradient by applying a linear gradient causing additional dephasing of a proton spindle in addition to the dephasing of proton spindle due to the RF signal.

Also, in the present specification, the term "slice" may denote a unit area on an object from which a magnetic resonance signal is acquired.

An MRI apparatus is an apparatus for acquiring a sectional image of a part of an object by expressing, in a contrast comparison, a strength of an MR signal with respect to a radio frequency (RF) signal generated in a magnetic field having a strength. For example, if an RF signal that only resonates an atomic nucleus (for example, a hydrogen atomic nucleus) is emitted for an instant toward the object placed in a strong magnetic field and then such emission stops, an MR signal is emitted from the atomic nucleus, and thus the MRI apparatus may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI apparatuses include characteristics different from those of other imaging apparatuses. Unlike imaging apparatuses such as CT apparatuses that acquire images according to a direction of detection hardware, MRI apparatuses may acquire 2D images or 3D volume images that are oriented toward an optional point. MRI apparatuses do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are used to precisely capture abnormal tissues.

Reference will now be made in detail to exemplary embodiments, examples of which are illustrated in the accompanying drawings. In this regard, the exemplary embodiments may have different forms and may not be construed as being limited to the descriptions set forth herein. For clarity of explanation, portions not relevant to the description are omitted. Throughout the specification, like reference numerals are indicated for like elements.

FIG. 1 is a block diagram of a general MRI system.

Referring to FIG. 1, the general MRI system may include a gantry 20, a signal transceiver 30, a monitor 40, a system controller 50, and an operating portion 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be acquired due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei and having precessional motion, an RF signal having the same frequency as that of the precessional motion to the patient, stop transmitting the RF signal, and then receive an MR signal emitted from the patient.

For example, to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

In the following description, an example in which the RF coil 26 is an RF multi-coil including N-number of coils corresponding to a plurality of channels that are the first to N-th channels is described. The RF multi-coil may be referred to as a multichannel RF coil.

The gantry 20 may further include a display 29 disposed outside the gantry 20 and a display disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal emitted from the object 10 through the RF coil 26 during a reception mode. The transmission and reception switch 34 may be controlled by a control signal output by an RF controller 56.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitor 44 monitors a state of the object 10. In detail, the object monitor 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system controller 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating portion 60. Here, the pulse sequence includes all information used to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating portion 60 may request the system controller 50 to transmit pulse sequence information while controlling an overall operation of the MRI system.

The operating portion 60 may include an image processor 62 for receiving and processing the MR signal received by the RF receiver 38, an output interface 64, and an input interface 66.

The image processor 62 may process the MR signal received from the RF receiver 38 to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may reconstruct image data by, for example, arranging digital data in a k-space of a memory and performing 2D or 3D Fourier transform on the data.

The image processor 62 may perform a composition process or difference calculation process on image data. The composition process may include an addition process on a pixel or a maximum intensity projection (MIP) process. The image processor 62 may store not only the rearranged image data but also image data on which a composition process or a difference calculation process is performed, in the memory or an external server.

The image processor 62 may perform any of the signal processes on the MR signal in parallel. For example, the image processor 62 may perform a signal process on a plurality of MR signals received by a multi-channel RF coil in parallel to rearrange the plurality of MR signals into image data.

The output interface 64 may output image data generated or rearranged by the image processor 62 to the user. The output interface 64 may also output information for the user to manipulate the MRI system, such as a user interface (UI), user information, or object information. Examples of the output interface 64 may include a speaker, a printer, a cathode ray tube (CRT) display, a liquid crystal display (LCD), a plasma display panel (PDP), an organic light emitting diode (OLED) display, a field emission display (FED), a light emitting diode (LED) display, a vacuum fluorescent display (VFD), a digital light processing (DLP) display, a flat panel display (PFD), a three-dimensional (3D) display, a transparent display, and other various output devices well known to one of ordinary skill in the art.

The user may input object information, parameter information, a scan condition, a pulse sequence, or information about image composition or difference calculation by using the input interface 66. The input interface 66 may be a keyboard, a mouse, a track ball, a voice recognizer, a gesture recognizer, a touch screen, or any one of other various input devices that are well known to one of ordinary skill in the art.

The signal transceiver 30, the monitor 40, the system controller 50, and the operating portion 60 are separate components in FIG. 1, but it will be obvious to one of ordinary skill in the art that respective functions of the signal transceiver 30, the monitor 40, the system controller 50, and the operating portion 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitor 40, the system controller 50, and the operating portion 60 may be connected to each other by wire or wirelessly, and when they are connected wirelessly, the MRI system may further include an apparatus for synchronizing clock signals therebetween. Communication between the gantry 20, the RF coil 26, the signal transceiver 30, the monitor 40, the system controller 50, and the operating portion 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

Figure 2:
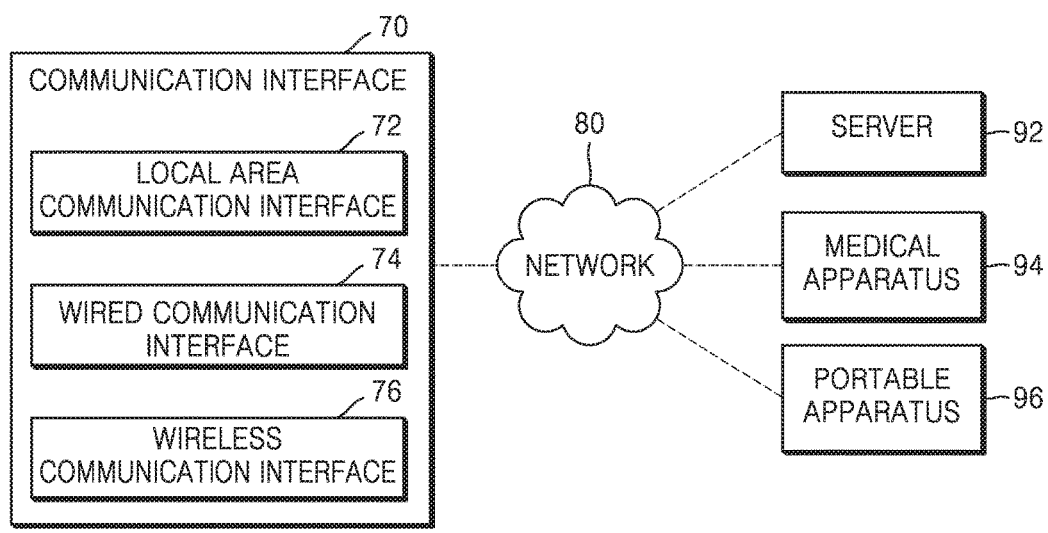
FIG. 2 is a block diagram illustrating a structure of a communication interface according to an exemplary embodiment.

FIG. 2 is a block diagram illustrating a structure of a communication interface 70 according to an exemplary embodiment. Referring to FIG. 2, the communication interface 70 may be connected to at least one selected from the gantry 20, the signal transceiver 30, the monitor 40, the system controller 50, and the operating portion 60 of FIG. 1.

The communication interface 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 2, the communication interface 70 may be connected to a network 80 by wire or wirelessly to communicate with a server 92, a medical apparatus 94, or a portable apparatus 96.

In detail, the communication interface 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communication interface 70 may receive a diagnosis history or a treatment schedule of the object from the server 92 and use the same to diagnose the object. The communication interface 70 may perform data communication not only with the server 92 or the medical apparatus 94 in a hospital, but also with the portable apparatus 96, such as a mobile phone, a personal digital assistant (PDA), or a laptop of a doctor or patient.

Also, the communication interface 70 may transmit information about a malfunction of the MRI system or about a medical image quality to a user through the network 80, and receive a feedback regarding the information from the user.

The communication interface 70 may include at least one component enabling communication with an external apparatus.

For example, the communication interface 70 may include a local area communication interface 72, a wired communication interface 74, and a wireless communication interface 76. The local area communication interface 72 refers to an interface for performing local area communication with an apparatus within a predetermined distance. Examples of local area communication technology according to an exemplary embodiment include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication interface 74 refers to an interface for performing communication by using an electric signal or an optical signal. Examples of wired communication technology according to an exemplary embodiment include wired communication techniques using a pair cable, a coaxial cable, and an optical fiber cable, and other well known wired communication techniques.

The wireless communication interface 76 transmits and receives a wireless signal to and from at least one selected from a base station, an external apparatus, and a server in a mobile communication network. Here, the wireless signal may be a voice call signal, a video call signal, or data in any one of various formats according to transmission and reception of a text/multimedia message.

Figure 3:
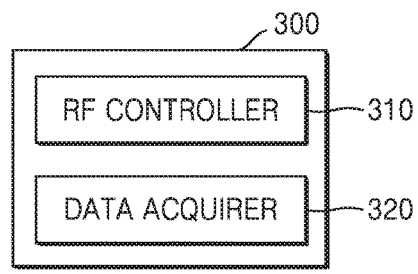
FIG. 3 is a block diagram of an MRI apparatus according to an exemplary embodiment.

FIG. 3 is a block diagram of an MRI apparatus 300 according to an exemplary embodiment.

The MRI apparatus 300 according to the exemplary embodiment may be any apparatus capable of scanning and/or processing (and/or reconstructing) an MR image. In detail, the MRI apparatus 300 may apply an RF pulse to an object through a plurality of channel coils included in a RF multi-coil and acquire magnetic resonance signals through the channel coils.

For example, the MRI apparatus 300 may be included in the MRI system described with reference to FIGS. 1 and 2. When the MRI apparatus 300 is included in the MRI system of FIG. 1, an RF controller 310 and a data acquirer 320 of FIG. 3 may respectively correspond to the RF controller 56 and the signal transceiver 30 of FIG. 1. The above-described RF multi-coil may correspond to the RF coil 26 of FIG. 1.

Also, the MRI apparatus 300 may be a server apparatus that provides a pulse sequence to be applied to the object, receives a magnetic resonance signal acquired by scanning an MR image, and reconstructs the MR image by using the received magnetic resonance signal. The server apparatus may be a medical server apparatus located in a hospital where a patient has an MRI scan, or in another hospital.

In detail, the MRI apparatus 300 may be the server 92, the medical apparatus 94, or the portable apparatus 96, which operates by being connected to the MRI system of FIGS. 1 and 2, and may receive the magnetic resonance signal acquired from the MRI system to reconstruct the MR image.

Referring to FIG. 3, the MRI apparatus 300 according to the exemplary embodiment may include the RF controller 310 and the data acquirer 320.

The RF controller 310 may control information about a signal strength (or signal intensity), application time, or application timing of the RF signal applied to the RF multi-coil, to scan an MR image of the object. The RF multi-coil may correspond to the RF coil 26 of FIG. 1.

Also, the RF controller 310 may be connected to the operating portion 60 of FIG. 1 and may receive an RF pulse sequence from the operating portion 60. In this case, the RF controller 310 may correspond to the RF controller 56 of FIG. 1.

According to an exemplary embodiment, the RF controller 310 may apply, to the object, at least one RF preparation pulse corresponding to a plurality of slices and an RF pulse corresponding to each of the slices. The RF preparation pulse is a pulse applied to the object prior to an excitation pulse applied to acquire a magnetic resonance signal. For example, the RF preparation pulse may include an inversion pulse, a labeling pulse, a T1 preparation pulse, or a T2 preparation pulse.

The inversion pulse may be a pulse applied to the object prior to the RF excitation pulse to restrict signals generated from cerebrospinal fluid or fat of target tissue, in a pulse sequence according to a fluid attenuated inversion recovery (FLAIR) technique, a short inversion time (TI) inversion recovery (STIR) technique, or a spectral presaturation with inversion recovery (SPIR) technique.

The labeling pulse may be, for example, a pulse applied to the object prior to the RF excitation pulse to emphasize a perfusion signal in an arterial spin labeling (ASL) technique.

The T1 preparation pulse may be a pulse applied to the object prior to the RF excitation pulse to emphasize a T1 contrast. In this case, the T1 preparation pulse may be applied to the object for the first time only in the whole TR process. Also, the T2 preparation pulse may be a pulse train applied to the object prior to the RF excitation pulse to emphasize a T2 contrast. For example, a T2 preparation pulse may include a pulse train of 90° x⁻180° y⁻90°–x.

Also, because the RF preparation pulse is a signal to selectively restrict (or emphasize) a signal of a fluid moving in tissue, even when the RF preparation pulse covers one slice, the RF preparation pulse may be applied to correspond to an area larger than one slice. Accordingly, when N-number of RF preparation pulses and N-number of pulses are applied to the object to acquire data from N-number of adjacent slices, areas on the object to which the preparation pulses are irradiated overlap one another and thus the acquired signals may be distorted.

Figure 4A:
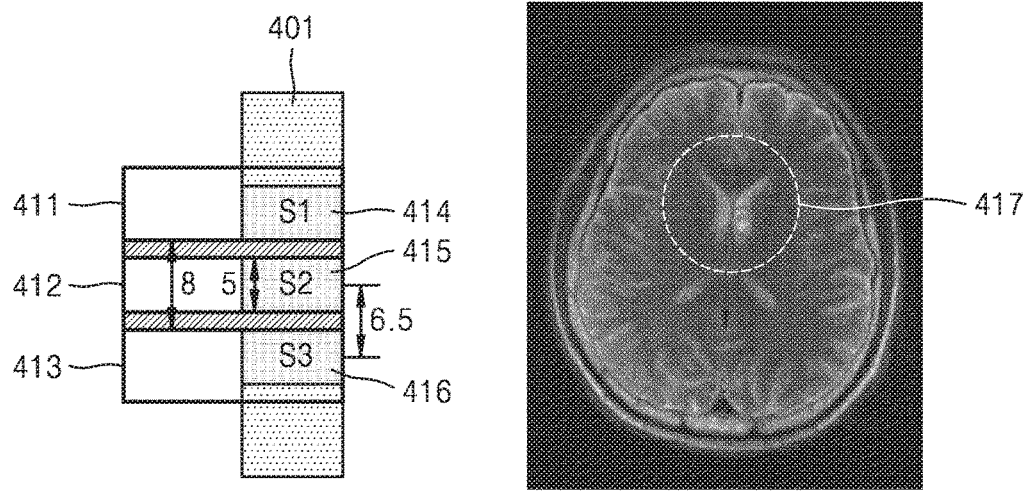
FIGS. 4A and 4B are diagrams illustrating an effect when areas in an object, to which RF preparation pulses are applied, overlap one another.
Figure 4B:
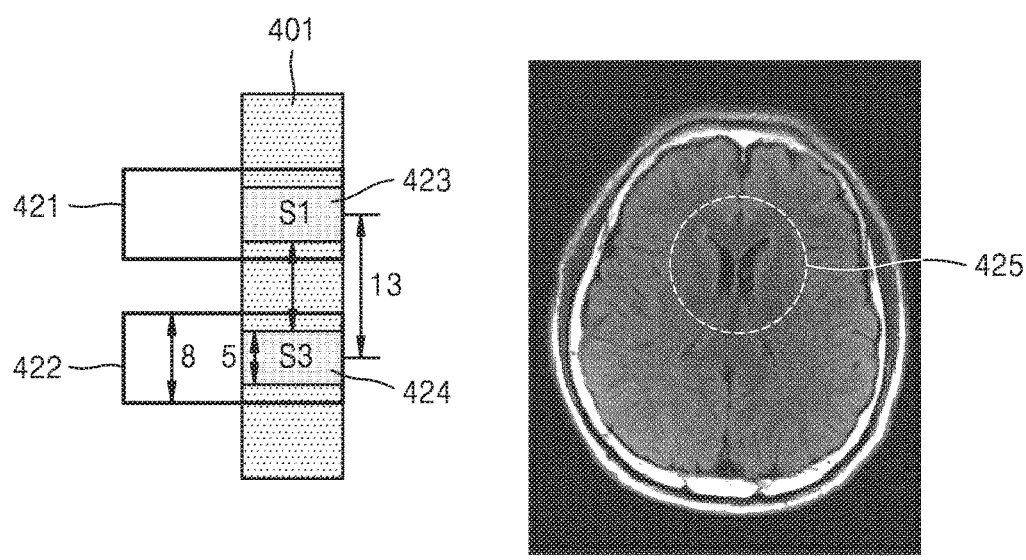

FIGS. 4A and 4B are diagrams illustrating an effect when areas in an object, to which RF preparation pulses are applied, overlap one another.

Referring to FIGS. 4A and 4B, in a general MRI apparatus, based on the FLAIR technique, magnetic resonance signals corresponding to a plurality of slices are acquired during one TR to generate an MR image. The MRI apparatus may apply, to the object, an RF preparation pulse corresponding to an area having a thickness of, for example, 8 mm, larger than a slice area having a thickness of, for example, 5 mm.

Referring to FIG. 4A, as areas 411, 412, and 413 on an object 401 corresponding to RF preparation pulses covering slices 414, 415, and 416 for acquiring k-space data overlap each other, the MRI apparatus may generate an MR image 417 in which cerebrospinal fluid is not restricted. As such, when the areas 411, 412, and 413 on the object 401 corresponding to the RF preparation pulses overlap each other, the RF preparation pulses may affect other slices. Accordingly, an effect of applying a preparation pulse to the object, that is, an effect of reducing a signal generated from the cerebrospinal fluid, may be reduced.

Accordingly, as illustrated in FIG. 4B, the MRI apparatus may acquire magnetic resonance signals from odd-numbered slices 423 and 424 and then magnetic resonance signals from even-numbered slices so that areas 421 and 422 of the object 401 corresponding to preparation pulses do not overlap each other. In this case, the MRI apparatus may effectively generate an MR image 425 in which the cerebrospinal fluid is restricted. However, because the magnetic resonance signals are acquired from the odd-numbered slices and then from the even-numbered slices, a long scan time is used. Accordingly, the MR image scanning method according to FIG. 4B is difficult to be used for clinical use.

Referring back to FIG. 3, the RF preparation pulse according to the exemplary embodiment may have a coverage area covering two or more slices. The coverage area may be an area on the object where magnetization of hydrogen atoms in tissue is generated by the preparation pulse. Accordingly, the preparation pulse having a coverage area covering two or more slices may mean that the preparation pulse affects an area including two or more adjacent slices. Accordingly, to cover N-number of adjacent slices, the RF controller 310 may apply RF preparation pulses less than N to the object. Accordingly, the RF controller 310 may prevent overlap of the areas to which the RF preparation pulses are applied. For example, when an RF preparation pulse covers three slices, for five adjacent slices, the RF controller 310 may apply to the object two RF preparation pulses and RF pulses, for example, one RF excitation pulse, corresponding to the five slices, and five RF refocusing pulses.

However, when the preparation pulse has a coverage area covering a plurality of slices, fluids to which no preparation pulse is applied may intrude into edge slices located at edges of the coverage area. Accordingly, the magnetic resonance signals acquired from the edge slices may include signals generated from the fluids to which no preparation pulse is applied.

The RF controller 310 according to the exemplary embodiment may move the coverage area of each of at least one RF preparation pulses for each TR. For example, the RF controller 310 may move the coverage area of an RF preparation pulse in units of slices, for example, a multiple of the thickness of a slice, for each TR. Accordingly, the RF controller 310 may change slices covered by the coverage area of an RF preparation pulse, for each TR, and may locate each slice at the center of the coverage area at least one time during a scan time. For example, when one RF preparation pulse covers three slices, for five slices, the RF controller 310 may cover slices such that a first RF preparation pulse covers first to third slices during a first TR and second to fourth slices during a second TR. As such, as the RF controller 310 moves the coverage areas of RF preparation pulses for each TR so that the slices may be located at the edge or center of the coverage area, a decrease in the effect of the preparation pulse on a slice, for example, a slice located at the edge of a coverage area, may be prevented.

The RF controller 310 may apply at least one RF preparation pulse to the object and then apply RF pulses corresponding to a plurality of slices to the object. The RF controller 310 may apply RF pulses to the object according to various pulse sequence techniques. For example, the RF controller 310 may apply RF pulses to the object according to any one or any combination of spin echo, fast spin echo (FSE), and gradient echo techniques.

For example, the MRI apparatus 300 may apply, to the object, RF preparation pulses according to the FSE technique and then apply one RF excitation pulse and a plurality of RF refocusing pulses.

The RF controller 310 may apply, to the object, at least one RF preparation pulses and then RF pulses corresponding to the respective slices covered by each of the RF preparation pulses after a preparation time TP has passed. The TP is used because a time is spent until net magnetization of tissue generated by the application of a preparation pulse becomes "0," to restrict (or emphasize) a signal of a tissue, for example, cerebrospinal fluid, fat, etc. For example, to restrict a signal generated from cerebrospinal fluid, the RF controller 310 may have a TP of about 2000 to 2500 ms after the RF preparation pulse is applied. Also, the RF controller 310 may have a TP of about 150 ms to restrict a fat signal.

Also, the RF controller 310 may control application timing of RF pulses based on a center slice located at a center of the coverage area among the slices covered by each RF preparation pulse. For example, the RF controller 310 may apply an RF preparation pulse and then apply an RF pulse corresponding to the center slice after a TP. For example, a first RF preparation pulse covering the first to third slices is applied to the object and then an RF pulse corresponding to the second slice is applied to the object at a time when a TP has passed. Accordingly, an RF pulse corresponding to the first slice and an RF pulse corresponding to the third slice may be applied to the object, respectively, before and after the TP. This is to acquire the clearest magnetic resonance signal from the center slice where the effect of the preparation pulse is the largest.

The data acquirer 320 may acquire raw data to reconstruct an MR image by performing MRI scanning on the object. The raw data may be a magnetic resonance signal having a form of an RF signal received from each of a plurality of channel coils included in an RF multi-coil through an MRI scan. Also, the data acquirer 320 may be connected to the RF receiver 38 of FIG. 1 or may receive a magnetic resonance signal from the RF receiver 38.

The data acquirer 320 according to the exemplary embodiment may acquire magnetic resonance signals from a plurality of slices during one TR. The data acquirer 320 may acquire k-space data by sampling a magnetic resonance signal emitted from the object in a k-space.

The acquired k-space data may be provided to an image processor. The image processor may reconstruct an MR image based on the k-space data provided from the data acquirer 320.

Alternatively, the data acquirer 320 may perform undersampling on the magnetic resonance signals. In this case, the undersampled data may be reconstructed by the data acquirer 320 or the image processor based on an additional calibration signal as in a generalized autocalibrating partially parallel acquisitions (GRAPPA) technique or coil sensitivity maps having additional coil information as in a simultaneous acquisition of spatial harmonics (SMASH) technique.

Figure 5:
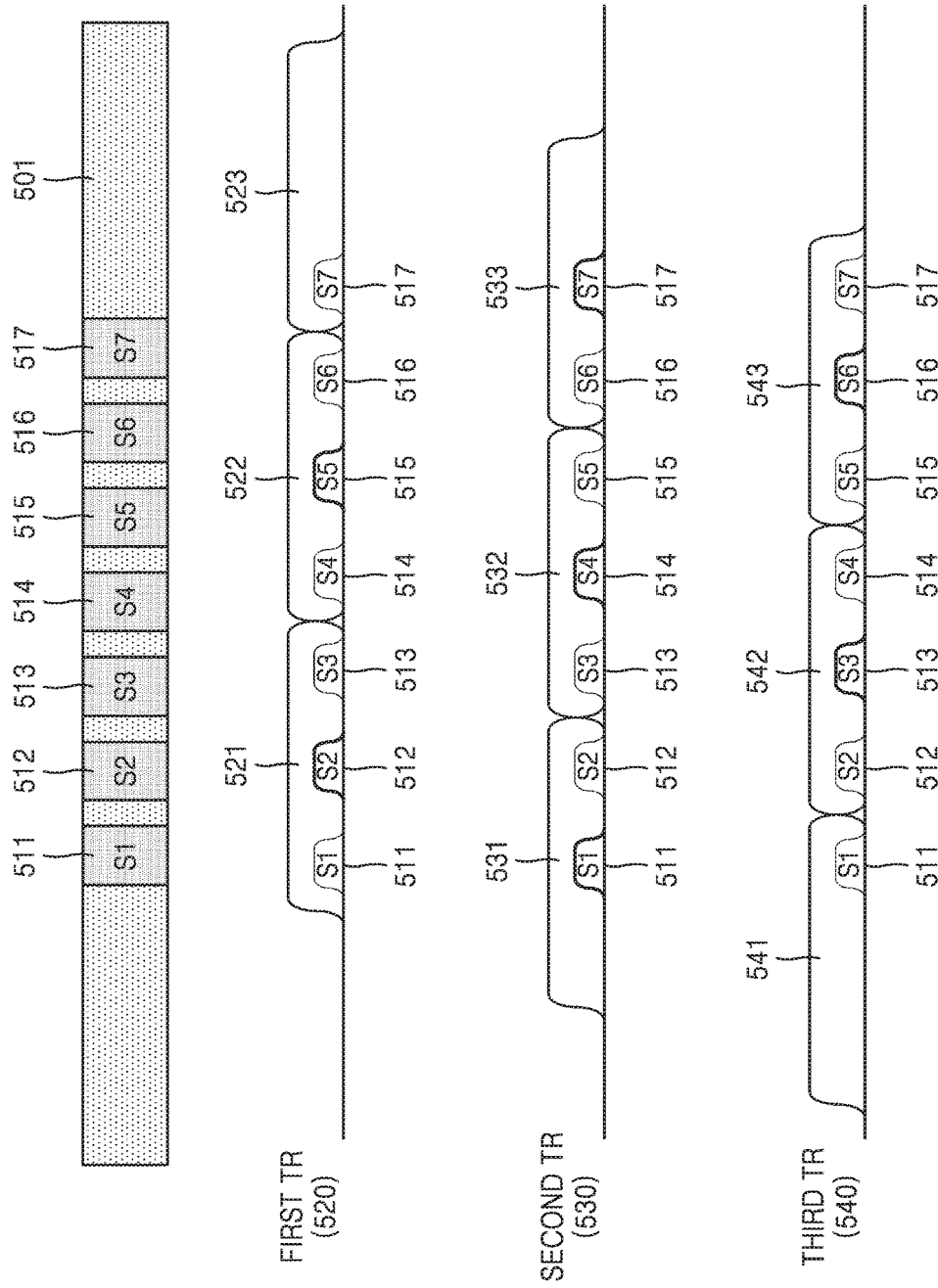
FIG. 5 is a diagram illustrating that a coverage area of a preparation pulse is moved for each repetition time TR, according to an exemplary embodiment.

FIG. 5 is a diagram illustrating that a coverage area of a preparation pulse is moved for each TR, according to an exemplary embodiment. In FIG. 5, it is assumed that one RF preparation pulse has a coverage area covering three slices.

Referring to FIG. 5, the MRI apparatus 300 according to the exemplary embodiment may apply three RF preparation pulses corresponding to first to seventh slices 511 to 517 to the object during one TR.

In detail, the RF controller 310 may apply, to an object 501 a first RF preparation pulse having a coverage area 521 covering the first to third slices 511 to 513, a second RF preparation pulse having a coverage area 522 covering the fourth to sixth slices 514 to 516, and a third RF preparation pulse having a coverage area 523 covering the seventh slice 517, during a first TR 520.

Then, the RF controller 310 may move coverage areas 531, 532, and 533 of preparation pulses by the thickness of a slice. Accordingly, during a second TR 530, the RF controller 310 may apply, to the object 501, a first RF preparation pulse having the coverage area 531 covering the first and second slices 511 and 512, a second RF preparation pulse having the coverage area 532 covering the third to fifth slices 513 to 515, and a third RF preparation pulse having the coverage area 533 covering the sixth and seventh slices 516 and 517.

Also, during a third TR 540, the RF controller 310 may move coverage areas 541, 542, and 543 of preparation pulses by the thickness of a slice. During the third TR 540, the RF controller 310 may apply, to the object 501, a first RF preparation pulse having the coverage area 541 covering the first slice 511, a second RF preparation pulse having the coverage area 542 covering the second to fourth slices 512 to 514, and a third RF preparation pulse having the coverage area 543 covering the fifth to seventh slices 515 to 517.

As such, as the MRI apparatus 300 applies RF preparation pulses having coverage areas covering two or more slices to the object, the overlap of the areas on the object to which RF preparation pulses are applied may be reduced. Also, as the MRI apparatus 300 moves the coverage areas of RF preparation pulses for each TR, each slice may be arranged at the center of coverage area.

Figure 6:
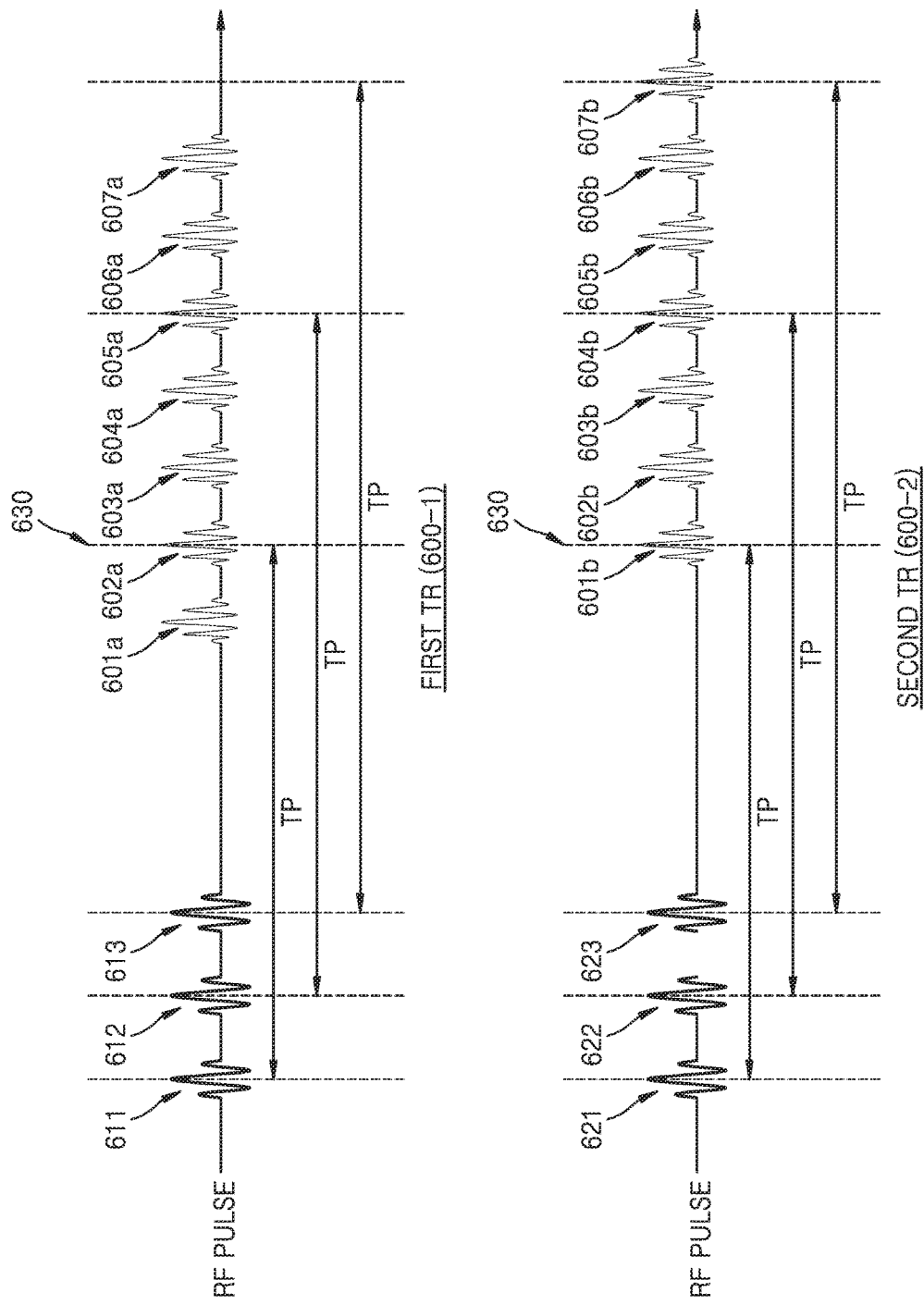
FIG. 6 is a diagram illustrating application timing in which a radio frequency (RF) controller applies an RF pulse, according to an exemplary embodiment.

FIG. 6 is a diagram illustrating application timing in which the RF controller 310 applies RF pulses, according to an exemplary embodiment. In FIG. 6, it is assumed that three RF preparation pulses corresponding to the first to seventh slices 511 to 517 of FIG. 5 are applied to the object by moving the coverage areas for each TR.

Referring to a diagram 600-1 of FIG. 6, the RF controller 310 may apply, to the object, a first RF preparation pulse 611 having a coverage area 521 of FIG. 5 covering the first to third slices 511 to 513, a second RF preparation pulse 612 having the coverage area 522 of FIG. 5 covering the fourth to sixth slices 514 to 516, and a third RF preparation pulse 613 having the coverage area 523 of FIG. 5 covering the seventh slice 517.

Also, the RF controller 310 may control application timing of a second RF pulse 602a corresponding to the second slice 512 located at the center of the coverage area 521 of the first RF preparation pulse 611, among pulses 601a to 607a, to the object, at a time point 630 when a TP has passed after the first RF preparation pulse 611 is applied. Accordingly, first and third RF pulses 601a and 603a respectively corresponding to the first and third slices 511 and 513 located at the edges of the coverage area 521 of the first RF preparation pulse 611 may be applied respectively before or after the TP has passed.

Also, because the coverage areas of RF preparation pulses are moved for each TR, during a second TR, the RF controller 310 may control application timing of a first RF pulse 601b corresponding to the first slice 511, among pulses 601b to 607b, to the object, at a time point when the TP has passed after a first RF preparation pulse 621 has passed, as illustrated in a diagram 600-2 of FIG. 6. This is because, during the second TR, the first slice 511 is located at the center of the coverage area 531 of the first RF preparation pulse 621.

As such, the MRI apparatus 300 according to the exemplary embodiment may prevent a decrease in the effect of the preparation pulse in a slice.

According to an exemplary embodiment, the TP may mean the same as an inversion time TI. Also, although FIG. 6 illustrates that one RF pulse corresponding to each slice is applied to the object during one TR for convenience of explanation, more or less number of RF pulses corresponding to each slice may be applied to the object during one TR based on a scanning technique.

Figure 7:
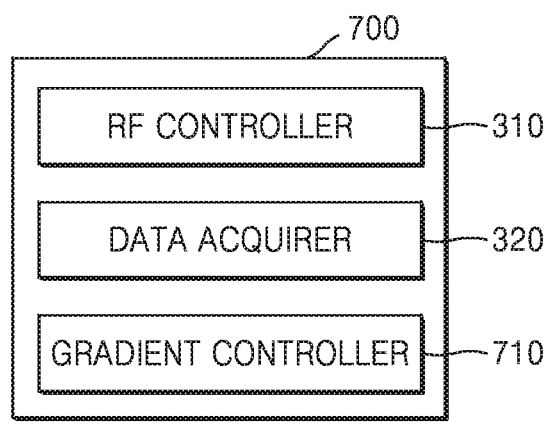
FIG. 7 is a block diagram of an MRI apparatus according to another exemplary embodiment.

FIG. 7 is a block diagram of an MRI apparatus 700 according to another exemplary embodiment.

Referring to FIG. 7, the MRI apparatus 700 may further include a gradient controller 710 in addition to the RF controller 310 and the data acquirer 320 of FIG. 3.

The gradient controller 710 may control a gradient coil to generate a spatial encoding gradient. Also, the spatial encoding gradient may include gradients in directions along an X axis, a Y axis, and a Z axis. In detail, the spatial encoding gradient may be presented in a 3D k-space, and the gradients in the X-axis, Y-axis, and Z-axis directions may respectively correspond to kx, ky, and kz axes. The gradients in the X-axis, Y-axis, and Z-axis directions may respectively correspond to a frequency encoding gradient, a phase encoding gradient, and a slice selection gradient. In an exemplary embodiment, the gradient in the frequency encoding direction may correspond to a gradient in the Y-axis in the k-space, that is, the ky axis direction.

When the spatial encoding gradient is applied to the object, different resonance frequencies are induced for parts of the object so that spatial information of the respective parts may be provided. Accordingly, as the spatial encoding gradient is applied to the object, the magnetic resonance signals of the object received by the data acquirer 320 may include spatial information presented in a 3D coordinate system. Accordingly, the gradient controller 710 may control the gradient coil to apply a spatial encoding gradient corresponding to each of a plurality of slices to the object.

The gradient controller 710 may apply, to the object, a slice selection gradient including a pulse to select a slice, a frequency encoding gradient to acquire spatial information in the X-axis direction, and a phase encoding gradient to acquire spatial information in the Y-axis direction.

According to the exemplary embodiment, the gradient controller 710 may apply different phase encoding gradients to two or more slices covered by the coverage area. The application of different phase encoding gradients may signify that the gradient controller 710 changes the shape of a pulse included in a phase encoding gradient corresponding to each slice. For example, the gradient controller 710 may set the amplitude of a pulse included in a phase encoding gradient corresponding to each slice to be different from each other.

In detail, the gradient controller 710 may determine a phase encoding gradient corresponding to each slice based on the position of the slice in the coverage area. For example, the gradient controller 710 may apply a first phase encoding gradient to a center slice located at the center of the coverage area to acquire k-space data corresponding to the center of the k-space, and a second phase encoding gradient to an edge slice located at the edge of the coverage area to acquire k-space data corresponding to the edge of the k-space. In detail, when preparation pulses having a coverage area covering first to third slices are applied to the object, the gradient controller 710 may apply a first phase encoding gradient, for example, ky=0, to the second slice located at the center of the coverage area to acquire k-space data corresponding to the center of the k-space, and a second phase encoding gradient, for example, ky=0.5*ky, max, to the first and third slices located at the edges of the coverage area to acquire k-space data corresponding to the edges of the k-space.

Also, the gradient controller 710 may determine a phase encoding gradient corresponding to each slice based on the positions of slices in the coverage area and a k-space sampling pattern. The k-space sampling pattern may signify a pattern formed by signals acquired when a signal of a line or point in a 3D k-space is acquired and a signal of another line or point is not acquired. For example, the k-space sampling pattern may include a first area in which lines in the k-space, from which signals are acquired, are densely arranged and a second area in which lines in the k-space, from which signals are not acquired, are densely arranged. In this case, the gradient controller 710 may apply a first phase encoding gradient to a slice located at the center of the coverage area to acquire k-space data corresponding to the first area of the k-space, and a second phase encoding gradient to slices located at the edges of the coverage area to acquire k-space data corresponding to the second area of the k-space, based on the k-space sampling pattern.

After the RF controller 310 applies RF pulses corresponding to the respective slices into the gantry 20 of FIG. 1 in which a gradient is formed, the data acquirer 320 may receive magnetic resonance signals emitted from the object. The data acquirer 320 may acquire k-space data by sampling or undersampling the received magnetic resonance signal.

As such, as the gradient controller 710 applies different phase encoding gradients to slices covered by the coverage area, the data acquirer 320 may acquire k-space data corresponding to the most important area in the k-space from the center slice of the coverage area.

Also, according to the exemplary embodiment, as the RF controller 310 controls application timing of RF pulses corresponding to the respective slices, the data acquirer 320 may acquire the clearest magnetic resonance signal from the center slice of the coverage area in which the largest effect is induced by the preparation pulse. Also, as the RF controller 310 moves the coverage area for each TR, a decrease in the effect of the preparation pulse in a slice may be prevented.

Accordingly, the data acquirer 320 may acquire clear k-space data corresponding to the most important area in the k-space from the slice located at the center of the coverage area of an RF preparation pulse.

Figure 8:
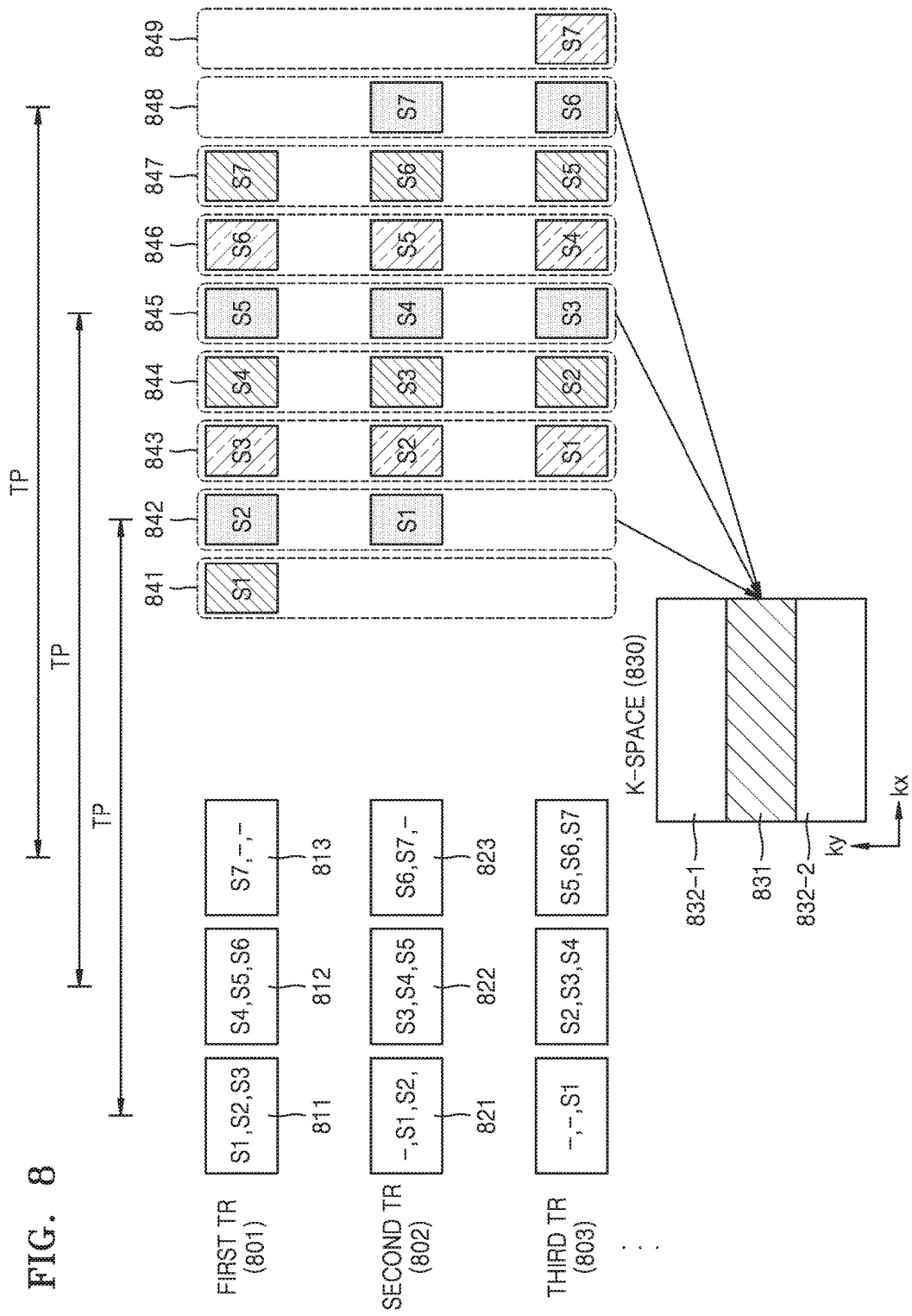
FIG. 8 is a diagram illustrating a method in which a data acquirer acquires k-space data, according to an exemplary embodiment.

FIG. 8 is a diagram illustrating a method in which the data acquirer 320 acquires k-space data, according to an exemplary embodiment.

Referring to FIG. 8, the MRI apparatus 700 may acquire k-space data from first to seventh slices S1 to S7.

In detail, during a first TR 801, the RF controller 310 may apply, to the object, a first RF preparation pulse 811 covering the first to third slices S1 to S3, a second RF preparation pulse 812 covering the fourth to sixth slices S4 to S6, and a third RF preparation pulse 813 covering the seventh slice S7. Also, when a TP has passed after the first RF preparation pulse 811, the second RF preparation pulse 812, and the third RF preparation pulse 813 are applied to the object, the RF controller 310 and the gradient controller 710 may apply RF pulses and spatial encoding gradients to acquire k-space data from the first to seventh slices S1 to S7. The gradient controller 710 may vary the phase encoding gradients corresponding to the second slice S2 located at the center of the coverage area of the first RF preparation pulse 811 and the first and third slices S1 and S3 located at the edges of the coverage area of the first RF preparation pulse 811. In detail, the gradient controller 710 may apply a first phase encoding gradient to the second slice S2 to acquire k-space data corresponding to a center area 831 of a k-space 830, and a second phase encoding gradient to the first and third slices S1 and S3 to acquire k-space data corresponding to edge areas 832-1 and 832-2 of the k-space 830. The gradient controller 710 may vary the phase encoding gradient corresponding to each slice, in the same method with respect to slices covered by the second and third preparation pulses 812 and 813.

Also, during a second TR 802, the RF controller 310 may apply, to the object, a first RF preparation pulse 821 covering the first and second slices S1 and S2, a second RF preparation pulse 822 covering the third to fifth slices S3 to S5, and a third RF preparation pulse 823 covering the sixth and seventh slices S6 and S7. Then, the RF controller 310 may determine application timing of RF pulses and spatial encoding gradients to the object, based on the position of each slice covered by the coverage area. Also, the gradient controller 710 may apply a first phase encoding gradient to the first slice S1 located at the center of the coverage area of the first RF preparation pulse 821 to acquire k-space data corresponding to the center area 831 of the k-space 830, and a second phase encoding gradient to the second slice S2 located at the edge of the coverage area of the first RF preparation pulse 821 to acquire k-space data corresponding to the edge areas 832-1 and 832-2 of the k-space 830. The gradient controller 710 may vary the phase encoding gradient corresponding to each slice in the same method with respect to the slices covered by the second and third preparation pulses 822 and 823.

Accordingly, the data acquirer 320 may acquire k-space data corresponding to the center area 831 of the k-space 830 from the second and fifth slices S2 and S5 during the first TR 801, k-space data corresponding to the center area 831 of the k-space 830 from the first, fourth, and seventh slices S1, S4, and S7 during the second TR 802, and k-space data corresponding to the center area 831 of the k-space 830 from the third and sixth slices S3 and S6 during a third TR 803.

As such, the MRI apparatus 700 may acquire k-space data corresponding to the center area 831 of the k-space 830 from center slices 842, 845, and 848 located at the centers of the coverage areas of the RF preparation pulses, and k-space data corresponding to the edge areas 832-1 and 832-2 of the k-space 830 from edge slices 841, 843, 844, 846, 847, and 849 located at the edges of the coverage areas of the RF preparation pulses, during the respective TR's. Accordingly, the MRI apparatus 700 may acquire k-space data corresponding to the center area 831 of the k-space 830 having the highest importance by using a clear magnetic resonance signal that is most affected by the preparation pulse.

Alternatively, according to an exemplary embodiment, the MRI apparatus 700 may reduce a scan time by performing full sampling on magnetic resonance signals acquired from the center slices 842, 845, and 848 located at the centers of the coverage areas of the preparation pulses and performing undersampling on magnetic resonance signals acquired from the edge slices 841, 843, 844, 846, 847, and 849 located at the edges of the coverage areas of the preparation pulses, during each TR. However, the present disclosure is not limited thereto. The MRI apparatus 700 may employ various sampling techniques for the center slices 842, 845, and 848 and the edge slices 841, 843, 844, 846, 847, and 849.

Figure 9:
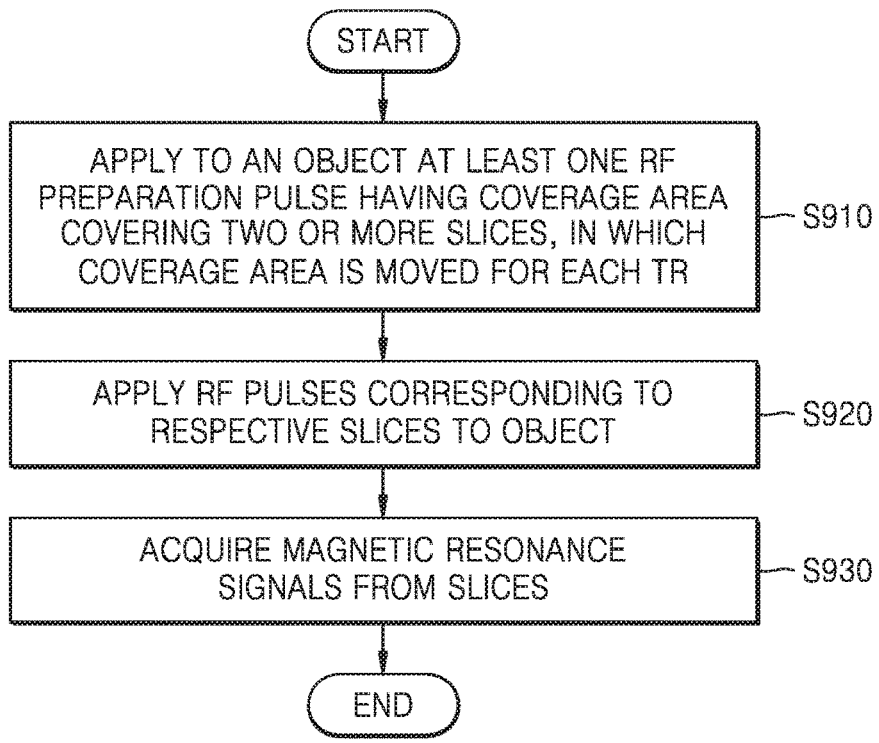
FIG. 9 is a flowchart illustrating a method in which an MRI apparatus scans an MR image, according to an exemplary embodiment.
Figure 10:
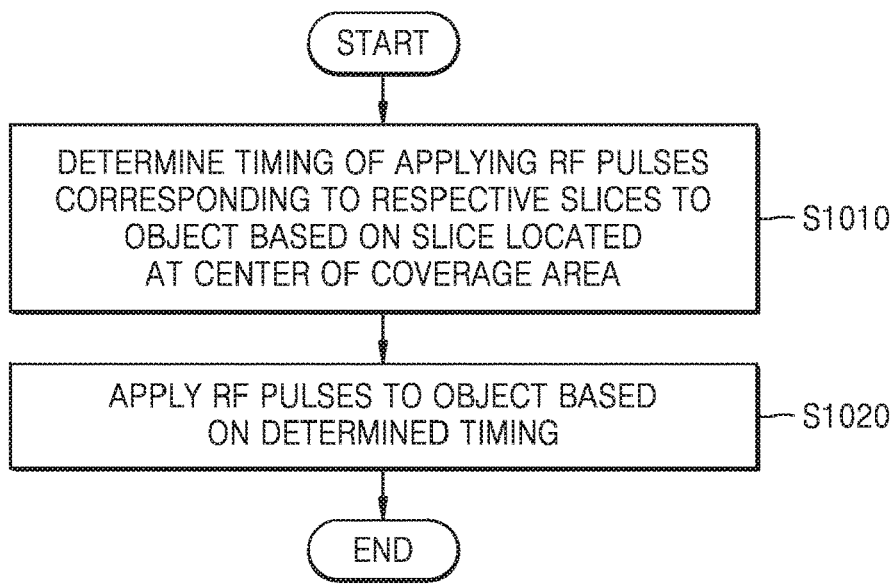
FIG. 10 is a flowchart illustrating a method in which an MRI apparatus determines application times of RF pulses, according to an exemplary embodiment.
Figure 11:
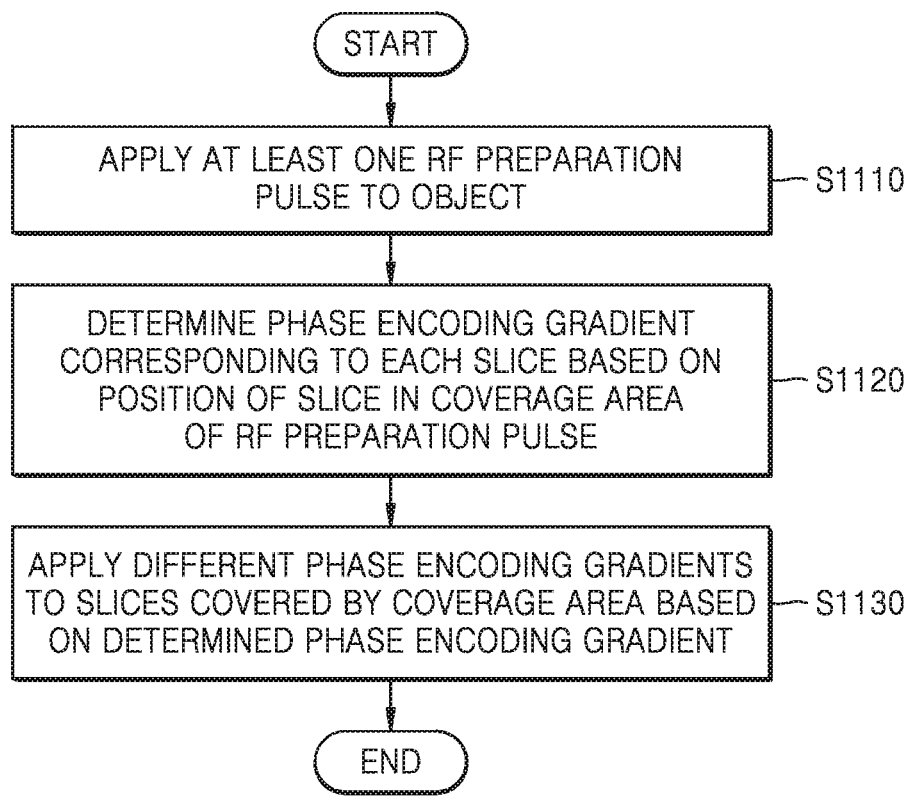
FIG. 11 is a flowchart illustrating a method in which an MRI apparatus applies a phase encoding gradient to slices, according to an exemplary embodiment.

FIGS. 9, 10, and 11 are flowcharts illustrating methods of scanning an MR image in the MRI apparatus 700, according to exemplary embodiments. The MRI scanning method of the MRI apparatus 700 illustrated in FIGS. 9 to 11 is related to the exemplary embodiment described with reference to FIGS. 1 to 8. Accordingly, the descriptions presented above in FIGS. 1 to 8, though omitted below, may be applied to the MRI scanning method of FIGS. 9 to 11.

FIG. 9 is a flowchart illustrating a method in which the MRI apparatus 700 scans an MR image, according to an exemplary embodiment.

Referring to FIG. 9, in Operation S910, the MRI apparatus 700 may apply, to an object, at least one RF preparation pulse having a coverage area covering two or more slices, in which the coverage area is moved for each TR.

The RF preparation pulse is applied to the object prior to an excitation pulse to acquire a magnetic resonance signal and may include, for example, an inversion pulse, a labeling pulse, a T1 preparation pulse, or a T2 preparation pulse.

Also, the RF preparation pulse may have a coverage area covering two or more slices. The coverage area may be an area on the object in which magnetization of hydrogen atoms in tissue is generated by the preparation pulse. Accordingly, the preparation pulse having a coverage area covering two or more slices may mean that the preparation pulse affects an area including two or more adjacent slices.

The MRI apparatus 700 may apply M-number of RF preparation pulses to the object to cover N-number of adjacent slices, where M is less than N.

Also, the MRI apparatus 700 may move the coverage area of each of at least one RF preparation pulses for each TR. For example, the RF controller 310 may move the coverage areas of RF preparation pulses in units of slices, for example, a multiple of the thickness of a slice, for each TR. Accordingly, the MRI apparatus 700 may vary slices covered by the coverage area of an RF preparation pulse for each TR.

As such, as the MRI apparatus 700 moves the coverage areas of RF preparation pulses for each TR so that slices are located at the center or edge of the coverage area, a decrease in the effect of the preparation pulse on a slice, for example, a slice located at the edge of a coverage area, may be prevented.

In Operation S920, the MRI apparatus 700 may apply RF pulses corresponding to respective slices to the object. The MRI apparatus 700 may apply RF pulses according to various pulse sequence techniques. For example, the MRI apparatus 700 may apply RF pulses to the object according to any one or any combination of spin echo, fast spin echo (FSE), and gradient echo techniques.

For example, the MRI apparatus 700 may apply RF preparation pulses based on the FSE technique and then one RF excitation pulse and a plurality of RF refocusing pulses, to the object.

The application timing of RF pulses applied by the MRI apparatus 700 is described below in detail with reference to FIG. 10.

In Operation S930, the MRI apparatus 700 may acquire magnetic resonance signals from slices during one TR. The MRI apparatus 700 may acquire k-space data by sampling the magnetic resonance signals emitted from the object in the k-space.

The MRI apparatus 700 may reconstruct an MR image based on the k-space data.

Alternatively, the MRI apparatus 700 may perform undersampling on the magnetic resonance signal. In this case, the MRI apparatus 700 may reconstruct the undersampled data based on an additional calibration signal as in the GRAPPA technique or coil sensitivity maps having additional coil information as in the SMASH technique.

FIG. 10 is a flowchart illustrating a method in which the MRI apparatus 700 determines application times of RF pulses, according to an exemplary embodiment.

Referring to FIG. 10, in Operation S1010, the MRI apparatus 700 may determine timing of applying RF pulses to the object, based on a slice located at the center of a coverage area.

The MRI apparatus 700 may apply, to the object, at least one RF preparation pulses and then RF pulses corresponding to the respective slices covered by each of the RF preparation pulses after a TP has passed. The TP is used because a time is spent until net magnetization of tissue generated by the application of a preparation pulse becomes "0," to restrict (or emphasize) a signal of a tissue, for example, cerebrospinal fluid, fat, etc. For example, to restrict a signal generated from cerebrospinal fluid, the MRI apparatus 700 may have a TP of about 2000 to 2500 ms after the RF preparation pulse is applied. Also, the MRI apparatus 700 may have a TP of about 150 ms to restrict a fat signal.

In detail, the MRI apparatus 700 may control application timing of the RF pulses applied to the object based on the center slice located at the center of the coverage area among the slices covered by the RF preparation pulse. For example, the RF controller 310 may control the RF pulse corresponding to the center slice to be applied after a TP after the RF preparation pulse is applied. For example, the RF pulse corresponding to the second slice may be applied at a time point when a TP has passed after a first RF preparation pulse covering first to third slices is applied. Accordingly, the RF pulse corresponding to the first slice and the RF pulse corresponding to the third slice may be applied before and after the TP has passed. This is to acquire the clearest magnetic resonance signal from the center slice where the effect of the preparation pulse is the largest.

In Operation S1020, the MRI apparatus 700 may apply RF pulses corresponding to the respective slices to the object, based on the determined timing. Because the exemplary embodiment of FIG. 6 may be applied to the method in which the MRI apparatus 700 applies RF pulses to the object, a detailed description thereof is omitted.

FIG. 11 is a flowchart illustrating a method in which the MRI apparatus 700 applies a phase encoding gradient to slices, according to an exemplary embodiment.

Referring to FIG. 11, in Operation S1110, the MRI apparatus 700 may apply at least one RF preparation pulse to the object. Because the operation S1110 corresponds to the operation S910 of FIG. 9, a detailed description thereof is omitted.

In Operation S1120, the MRI apparatus 700 may determine a phase encoding gradient corresponding to each slice, based on the position of the slice in the coverage area of an RF preparation pulse.

The MRI apparatus 700 may generate a spatial encoding gradient including a frequency encoding gradient, a phase encoding gradient, and a slice selection gradient, in the gantry 20 of FIG. 1.

In detail, the MRI apparatus 700 may determine a phase encoding gradient based on whether each slice is located at the center of a coverage area of an RF preparation pulse. When the slice is located at the center of a coverage area, the MRI apparatus 700 may determine a first phase encoding gradient to acquire k-space data corresponding to the center of the k-space. When the slice is located at an edge of the coverage area, the MRI apparatus 700 may determine a second phase encoding gradient to acquire k-space data corresponding to the edge of the k-space.

For example, when preparation pulses having coverage areas covering the first to third slices are applied to the object, the MRI apparatus 700 may determine a first phase encoding gradient, for example, ky=0, to acquire k-space data corresponding to the center of k-space to be applied to the second slice located at the center of the coverage area, and a second phase encoding gradient, for example, ky=0.5*ky, max, to acquire k-space data corresponding to the edge of k-space to be applied to the first and third slices located at the edges of the coverage area.

Also, the MRI apparatus 700 may determine a phase encoding gradient corresponding to each slice based on the positions of slices in a coverage area and a k-space sampling pattern. The k-space sampling pattern may signify a pattern formed by signals acquired when a signal of a line or point in a 3D k-space is acquired and a signal of another line or point is not acquired. For example, the k-space sampling pattern may include a first area in which lines in the k-space, from which signals are acquired, are densely arranged and a second area in which lines in the k-space, from which signals are not acquired, are densely arranged. In this case, the MRI apparatus 700 may determine a first phase encoding gradient to be applied to a slice located at the center of the coverage area to acquire k-space data corresponding to the first area of the k-space, and a second phase encoding gradient to be applied to slices located at the edges of the coverage area to acquire k-space data corresponding to the second area of the k-space, based on the k-space sampling pattern.

In Operation S1130, the MRI apparatus 700 may apply different phase encoding gradients to slices covered by a coverage area of an RF preparation pulse, based on the determined phase encoding gradient.

As described above, the MRI apparatus 700 may acquire the clearest magnetic resonance signal from the center slice of the coverage where the effect of the preparation pulse is the largest, by controlling the application timing of RF pulses corresponding to the respective slices. Also, the MRI apparatus 700 may prevent a decrease in the effect of the preparation pulse on a slice by moving the coverage area for each TR.

Also, the MRI apparatus 700 may acquire k-space data corresponding to the most important area in the k-space from the center area of the coverage area by applying different phase encoding gradient to the slices covered by the coverage area of the RF preparation pulse.

Accordingly, as the MRI apparatus 700 acquires the clearest magnetic resonance signal corresponding to the most important area in the k-space, the MRI apparatus 700 may generate an MR image in which a signal of a tissue, for example, cerebrospinal fluid, fat, etc., is effectively restricted (or emphasized).

The exemplary embodiments can be written as computer programs and can be implemented in general-use digital computers that execute the programs using a computer-readable recording medium.

Further, in order for the processor of the computer to execute the above-mentioned functions, when the processor communicates with any other computers or servers, etc. at a remote location, the computer may further include information about how to communicate with any other computers or servers at a remote location or which information or media the processor of the computer transmits and receives at the time of the communication, by using a communication interface (for example, wired and/or wireless communication interface) of the computer.

Further, a functional program for implementing the exemplary embodiments, a code and a code segment associated therewith, and the like may be easily inferred or changed by programmers in the art to which the exemplary embodiments pertain in consideration of a system environment of the computer that reads the recording medium and executes the program.

Hereinabove, examples of a computer-readable recording medium recorded with programs as described above include a ROM, a RAM, a CD-ROM, a magnetic tape, a floppy disk, an optical media storage device, and the like.

Further, a computer-readable recording medium recorded with programs as described above may be distributed to a computer system connected through a network and thus store and execute a computer-readable code by a distributed manner. In this case, at least one computer among a plurality of distributed computers may execute a part of the above-mentioned functions and transmit the executed results to any one or any combination of the other distributed computers, and the computer receiving the result may also execute a part of the above-mentioned functions and provide the executed results to the other distributed computers.

Although it has been described in the above that all the components of an exemplary embodiment are coupled as a single unit or coupled to be operated as a single unit, is the exemplary embodiments are not necessarily limited thereto. Namely, one or more components among the components may be selectively coupled to be operated as one or more units. Also, although each of the components may be implemented as an independent hardware, some or all of the components may be selectively combined with each other, so that they may be implemented as a computer program having one or more program modules for performing some or all of the functions combined in one or more hardwares. Codes and code segments forming the computer program can be easily conceived by an ordinarily skilled person in the technical field. Such a computer program may implement the exemplary embodiments by being stored in a computer-readable medium, and being read and executed by the computer. Storage mediums for storing the computer program may include a magnetic recording medium, an optical recording medium, etc.

A computer-readable recording medium recorded with applications, which are programs for executing the game item service method in accordance with the exemplary embodiments, may be a storage medium (for example, hard disk, and the like) included in an application store server or an application providing server such as a web server associated with applications or corresponding services, and the like, or the application providing server itself Although exemplary embodiments have been described for illustrative purposes, those having ordinary knowledge in the technical field will appreciate that various modifications, additions and substitutions are possible, without departing from the scope and spirit as disclosed in the accompanying claims. Therefore, the exemplary embodiments are intended to illustrate the scope of the technical idea, and the scope of the technical idea is not limited by the exemplary embodiments. The protection scope may be construed based on the accompanying claims, and it may be construed that all of the technical ideas included within the scope equivalent to the claims are included within the right scope.

What is claimed is:

1. A magnetic resonance imaging (MRI) apparatus comprising:
   a radio frequency (RF) controller configured to, for a repetition time period:
      control the MRI apparatus to apply, to an object, an RF preparation pulse having a coverage area covering two or more slices among a plurality of slices of the object;
      control the MRI apparatus to apply, to the object, RF pulses respectively corresponding to the plurality of slices; and
      move the coverage area; and
   a data acquirer configured to acquire magnetic resonance signals from the plurality of slices during the repetition time period.

2. The MRI apparatus of claim 1, further comprising a gradient controller configured to control the MRI apparatus to apply different phase encoding gradients to the two or more slices covered by the coverage area.

3. The MRI apparatus of claim 2, wherein the gradient controller is further configured to determine each of the phase encoding gradients, based on either one or both of a position of a slice in the coverage area and a k-space sampling pattern.

4. The MRI apparatus of claim 2, wherein the gradient controller is further configured to control the MRI apparatus to:
   apply a first phase encoding gradient to a slice that is located at a center of the coverage area to acquire k-space data of a center of a k-space; and
   apply a second phase encoding gradient to a slice that is located at an edge of the coverage area to acquire k-space data of an edge of the k-space.

5. The MRI apparatus of claim 1, wherein the RF controller is further configured to, for the repetition time period, move the coverage area in a unit of a slice.

6. The MRI apparatus of claim 1, wherein, as the coverage area is moved, the two or more slices covered by the coverage area are changed.

7. The MRI apparatus of claim 1, wherein the RF controller is further configured to:
   determine times of the application of the RF pulses to the object, based on a slice that is located at a center of the coverage area; and
   control the MRI apparatus to apply, to the object, the RF pulses respectively corresponding to the plurality of slices, based on the determined times.

8. The MRI apparatus of claim 1, wherein the RF preparation pulse is any one or any combination of an inversion pulse, a labeling pulse, a T1 preparation pulse, and a T2 preparation pulse.

9. The MRI apparatus of claim 1, wherein the RF controller is further configured to control the MRI apparatus to apply, to the object, the RF pulses respectively corresponding to the plurality of slices, based on any one or any combination of a spin echo technique, a gradient echo technique, and a fast spin echo technique.

10. A method of scanning a magnetic resonance image, using a multi-slice technique, the method comprising:
for a repetition time period:
applying, to an object, a radio frequency (RF) preparation pulse having a coverage area covering two or more slices among a plurality of slices of the object;
applying, to the object, RF pulses respectively corresponding to the plurality of slices; and
moving the coverage area; and
acquiring magnetic resonance signals from the plurality of slices during the repetition time period.

11. The method of claim 10, further comprising applying different phase encoding gradients to the two or more slices covered by the coverage area.

12. The method of claim 11, wherein the applying of the phase encoding gradients comprises determining each of the phase encoding gradients, based on a position of a slice in the coverage area.

13. The method of claim 11, wherein the applying of the phase encoding gradients comprises:
applying a first phase encoding gradient to a slice that is located at a center of the coverage area to acquire k-space data of a center of a k-space; and
applying a second phase encoding gradient to a slice that is located at an edge of the coverage area to acquire k-space data of an edge of the k-space.

14. The method of claim 10, wherein the moving of the coverage area comprises, for the repetition time period, moving the coverage area in a unit of a slice.

15. The method of claim 10, wherein, as the coverage area is moved, the two or more slices covered by the coverage area are changed.

16. The method of claim 10, wherein the applying of the RF pulses comprises:
determining times of the application of the RF pulses to the object, based on a slice that is located at a center of the coverage area; and
applying, to the object, the RF pulses respectively corresponding to the plurality of slices, based on the determined times.

17. The method of claim 10, wherein the RF preparation pulse is any one or any combination of an inversion pulse, a labeling pulse, a T1 preparation pulse, and a T2 preparation pulse.

18. The method of claim 10, wherein the applying of the RF pulses comprises applying, to the object, the RF pulses respectively corresponding to the plurality of slices, based on any one or any combination of a spin echo technique, a gradient echo technique, and a fast spin echo technique.

19. A non-transitory computer-readable storage medium storing a program to cause a computer to perform the method of claim 10.

20. A magnetic resonance imaging (MRI) apparatus comprising:
a radio frequency (RF) controller configured to:
control the MRI apparatus to apply a first RF preparation pulse to a first coverage area comprising first slices among a plurality of slices of an object during a first repetition time period;
control the MRI apparatus to apply RF pulses respectively to the plurality of slices to which the first RF preparation pulse is applied, during the first repetition time period;
move the first coverage area in a unit of a slice to a second coverage area comprising second slices among the plurality of slices during a second repetition time period, the second slices being different than the first slices;
control the MRI apparatus to apply a second RF preparation pulse to the second coverage area during the second repetition time period; and
control the MRI apparatus to apply the RF pulses respectively to the plurality of slices to which the second RF preparation pulse is applied, during the second repetition time period; and
a data acquirer configured to acquire magnetic resonance signals from the plurality of slices during the first repetition time period and the second repetition time period.

* * * * *